United States Patent [19]

Winters

[11] Patent Number: 5,428,564
[45] Date of Patent: Jun. 27, 1995

[54] SIX TRANSISTOR DYNAMIC CONTENT ADDRESSABLE MEMORY CIRCUIT

[75] Inventor: Kel D. Winters, Moscow, Id.

[73] Assignee: Advanced Hardware Architectures, Inc., Moscow, Id.

[21] Appl. No.: 924,676

[22] Filed: Aug. 3, 1992

[51] Int. Cl.⁶ .............................................. G11C 13/00
[52] U.S. Cl. ........................................ 365/49; 365/174; 365/154
[58] Field of Search ................ 365/49, 174, 154, 188, 365/189.01, 190, 203

[56] References Cited

U.S. PATENT DOCUMENTS

| | | | |
|---|---|---|---|
| 3,701,980 | 10/1972 | Mundy | 365/49 |
| 4,831,585 | 5/1989 | Wade et al. | 365/49 |
| 5,111,427 | 5/1992 | Kobayashi | 365/49 |
| 5,126,968 | 6/1992 | Hamamoto | 365/49 |

OTHER PUBLICATIONS

J. Mindy, et al., "Low-Cost Associative Memory," IEEE Journal of Solid-State Circuits, vol. SC-7, p. 364–9, Oct. 1972.

J. Wade and C. Sodini, "Dynamic Cross-Coupled Bit-line Content Addressable Memory Cell For High Density Arrays," IEEE 85, p. 284–7, 1985.

*Primary Examiner*—Joseph A. Popek
*Assistant Examiner*—A. Zarabian
*Attorney, Agent, or Firm*—Haverstock, Medlen & Carroll

[57] ABSTRACT

A content addressable memory cell includes six transistors connected together to perform memory read, memory write, and matching operations. This cell has the ability to perform typical memory write and memory read operations as well as the capability of signalling whether or not its stored data matches data that is being searched for. A cross-coupling scheme is used in the memory cell so that a high potential will always be stored on the gate of a transistor whose source is at ground. This cross-coupling scheme increases the amount of charge stored on the storage transistor and decreases the required frequency of refresh operations. In addition to the transistors configured to store data, an additional transistor configured as a diode is used as a rapid discharge path to maximize the efficiency of the cell during a read operation. During a match operation another transistor is utilized to discharge the Match line quickly in the event the stored data does not match the data that is being searched for.

11 Claims, 3 Drawing Sheets

SIX TRANSISTOR DYNAMIC CONTENT ADDRESSABLE MEMORY CIRCUIT

FIELD OF THE INVENTION

This invention relates to the field of dynamic content addressable memory cells. More particularly, this invention relates to dynamic content addressable memory cells wherein the sense node is discharged during a read or match operation. Additionally, a voltage boot-strap technique is employed to enhance the cell performance.

BACKGROUND OF THE INVENTION

Content addressable memory cells perform typical random access memory read and write operations and also have the capability of matching the data being searched for to the data that is stored in the cell. Content addressable memory cells are used in a wide variety of digital systems. In a typical CAM cell each cell is coupled to two data lines, a Column line and a Column-Not line, which are used to input data to the cell during a write operation and output data from the cell during a read operation. The Column line and Column-Not line are also used to search for certain data during a match operation. During a write operation the data lines are forced to the opposite binary state one from the other.

A Write line is coupled to a content addressable memory cell to control the cell during a write operation when data is being stored in the cell. A Match line is also coupled to the cell to signal when data that is being searched for matches data that is stored in the memory cell.

An early content addressable memory cell was presented by Joseph L. Mundy in U.S. Pat. No. 3,701,980 and is shown in FIG. 1. This device is insensitive to electrical noise and cannot operate quickly enough for modern system requirements because the data is stored as a voltage across the gate and source of a single transistor. The effective stored voltage will typically be very small because during a write operation the gate and source of the storage transistor are at approximately the same potential.

Data is written to this cell by activating the Write line 115, which allows the voltages on the Column line 117 and the Column-Not line 118 (collectively referred to as the I/O lines) to be stored on the gates of the transistors 112 and 114, respectively. If the data to be stored is a "1", the Column line will be at a high potential and the Column-Not line at a low potential. When the Write line is charged to a high potential a high voltage will be stored at the gate of the transistor 112 and a low voltage will be stored at the gate of the transistor 114. Because of this the gate and source of the transistor 112 will both be at approximately the same potential and the voltage stored across the gate capacitance will be very small. This cell will need to be refreshed often because the potential stored across the gate capacitance of the storage transistors is small.

Data is read from the Mundy memory cell by activating the Match line 116. If a "1" is stored in the memory cell the voltage at the gate of the transistor 112 will be high and the voltage at the gate of the transistor 114 will be low. Because the gate of the transistor 114 is at a low potential, the Column-Not line 118 is isolated from the Match line. If there is a "1" stored in the memory cell the transistor 112 will have a high potential stored at its gate and the Column line 117 will be connected to the Match line. When the Match line is activated and brought to a high potential the Column line will follow, signalling that the data stored is a "1."

If the information stored in the memory cell is the inverse of the information on the I/O lines, the Match line 116 will be driven to a low potential. But, if the information stored in the memory cell is not the inverse of the information on the I/O lines the Match line will be charged to a high potential. Thus, if a "1" is stored in the memory cell the voltage at the gate of transistor 112 will be high and the voltage at the gate of the transistor 114 will be low. If the data to be searched for is also a "1", the Column line will be at a high potential and the Column-Not line will be at a low potential. Because the voltage at the gate of the transistor 112 is high, the Match line will be charged high, indicating a match between the stored data and the data on the I/O lines.

In the case where the data to be searched for is a "0", the Column line 117 voltage will be low and the potential of the Column-Not line 118 will be high. Because the voltage at the gate of the transistor 114 is low the Match line 116 will discharge. This signals that the data stored in the memory cell did not match the data that was sought.

A second content addressable memory cell was presented by Jon P. Wade in U.S. Pat. No. 4,831,585 and is shown in FIG. 2. This design improved the Mundy memory cell by cross-coupling the write transistors to the storage transistors so that a high voltage is always stored on a transistor whose source is at ground. This cross-coupling increased the voltage stored on these transistors, and thus increased the storage time and the reliability. This cell does not require refreshing as often as the Mundy cell.

During a Write operation, the Write line 216 must be activated and brought to a high potential. By activating the Write line, the transistor MW1 is allowed to store the data from the Column line 246 on the gate of the transistor MS1 and the transistor MW0 will store the data from the Column-Not line 248 on the gate of the transistor MS0. If a "1" is to be stored in the memory cell the Column line will be at a high potential and the Column-Not line will be at a low potential. When the Write line is activated the transistors MW1 and MW0 will connect the Column line to the gate of the transistor MS1 and the Column-Not line to the gate of the transistor MS0, respectively. This will store a high potential on the gate of the transistor MS1 and a low potential on the gate of the transistor MS0. When the Write line is deactivated the gates of the transistors MS1 and MS0 will be isolated from the Column line and the Column-Not line, respectively, such that the data will be stored at the gates of those transistors until another write operation is performed.

Data is read from this cell in the same fashion that data can be read from the Mundy cell. To read the data stored in the memory cell the Match line 234 must be charged to a high potential and the Column line 246 and the Column-Not line 248 must both be discharged to a low potential. If a "1" is stored in the memory cell the voltage at the gate of the transistor MS0 will be low, isolating the Column line from the Match line, and the voltage at the gate of the transistor MS1 will be high. Because the transistor MS1 is "on" the Column-Not line will be connected to the Match line and raised to a high potential. This data must then be inverted such that, during a read operation the raising of the Column-Not line to a high potential will signal that a "1" is stored in the memory cell and the raising of the Column line to a high potential will signal that a "0" is stored in the memory cell. Because of the characteristics of these N-channel transistors and the I/O lines, it takes a greater amount of time to raise the potential of the I/O lines to a high potential than it would to discharge an I/O line to a low potential through these devices.

To perform a search operation in this memory cell the Match line 234 must be kept at a high potential. The data to be searched for must also be inverted, as in the Mundy cell, before it is applied to the Column line 246 and the Column-Not line 248. If the stored data is the same as the inverted data to be searched for, no current will flow through the "on" transistor. But, if the stored data is not the same as the inverted data to be searched for, current will flow through the Match line through the "on" transistor to the respective I/O line signalling that the data did not match. Match line performance in this cell is limited by the gate-to-source voltage of the discharging transistor, which is initially depleted by the threshold voltage and is further coupled downward by the falling potential of the I/O line it is coupled to.

If a "1" is stored in the memory cell the gate of the transistor MS1 will be at a high potential and the gate of the transistor MS0 will be at a low potential. If the data to be searched for is also a "1", after the inverse is applied to the Column line 246 its voltage will be low and the potential of the Column-Not line 248 will be high. Because the data stored is a one the transistor MS1 will be turned on, connecting the Column-Not line to the Match line 234 and the transistor MS0 is turned off isolating the Column line from the Match line. Since both the Column-Not line and the Match line are at a high potential, no current will flow through the Column-Not line and a Match will be detected.

If the data to be searched for is a "0", after the inverse is applied to the Column line 246 its voltage will be high and the potential of the Column-Not line 248 will be low. Because the data stored is a "1" the transistor MS1 will still be turned on, connecting the Column-Not line to the Match line 234 and the transistor MS0 is turned off isolating the Column line from the Match line. Since the Match line is at a high potential and the Column-Not line is at a low potential current will flow from the Match line through the Column-Not line, signalling that the data did not match.

What is needed is a content addressable memory cell having the ability to store a data bit with a sufficiently high gate-to-source voltage to avoid noise sensitivity. Further, a cell is needed which avoids the time delay associated with charging an I/O line during a read operation through N-channel devices in order to achieve access time requirements necessary for a modern system.

SUMMARY OF THE INVENTION

A content addressable memory cell includes six transistors connected together to perform memory read, memory write, and matching operations. Preferably, the six transistors are each enhancement mode NMOS transistors. This cell has the ability to perform typical memory write and memory read operations as well as the capability of signalling whether or not its stored data matches data that is being searched for. A cross-coupling scheme is used in the memory cell so that a high potential will always be stored on the gate of a transistor whose source is at ground. This cross-coupling increases the amount of charge stored on the storage transistor and decreases the required frequency of refresh operations. In addition to the transistors configured to store data, an additional transistor configured as a diode is used as a rapid discharge path to maximize the efficiency of the cell during a read operation. During a match operation another transistor is utilized to discharge the Match line quickly in the event the stored data does not match the data that is being searched for.

DETAILED DESCRIPTION OF THE PREFERRED EMBODIMENT

Figure 1:
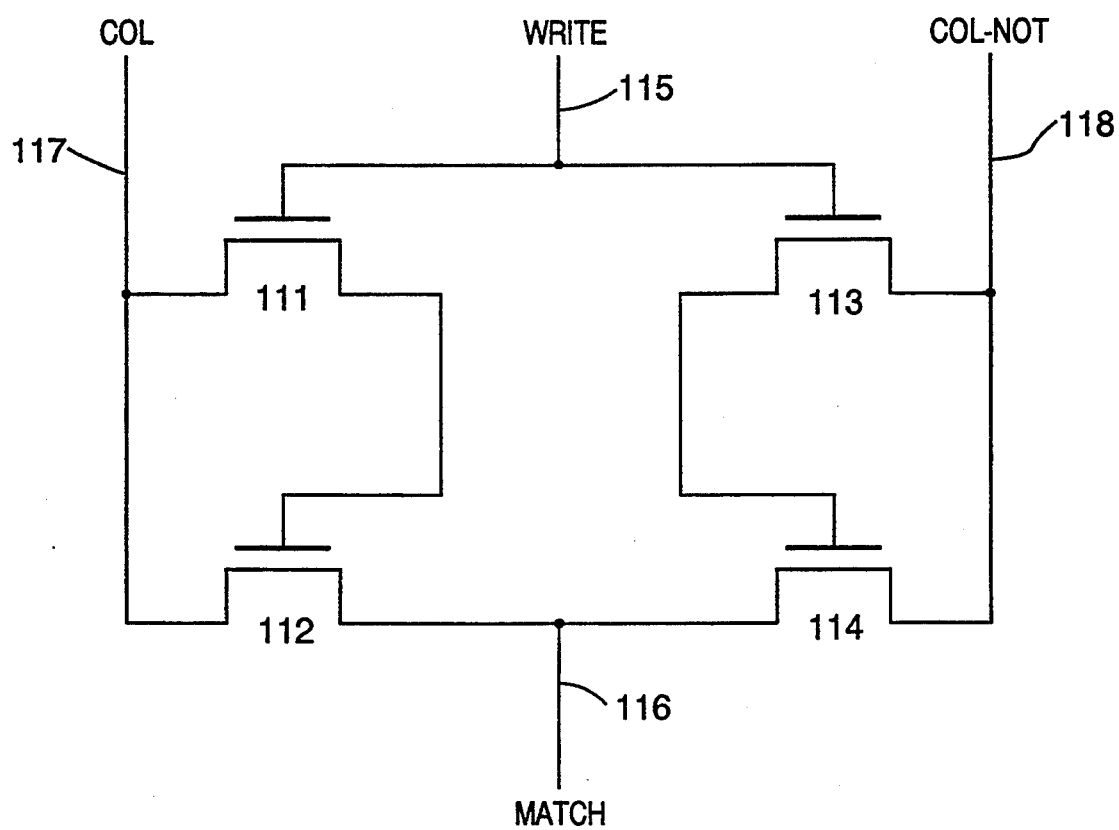
FIG. 1 is a schematic illustration of the prior art Mundy memory cell.
Figure 2:
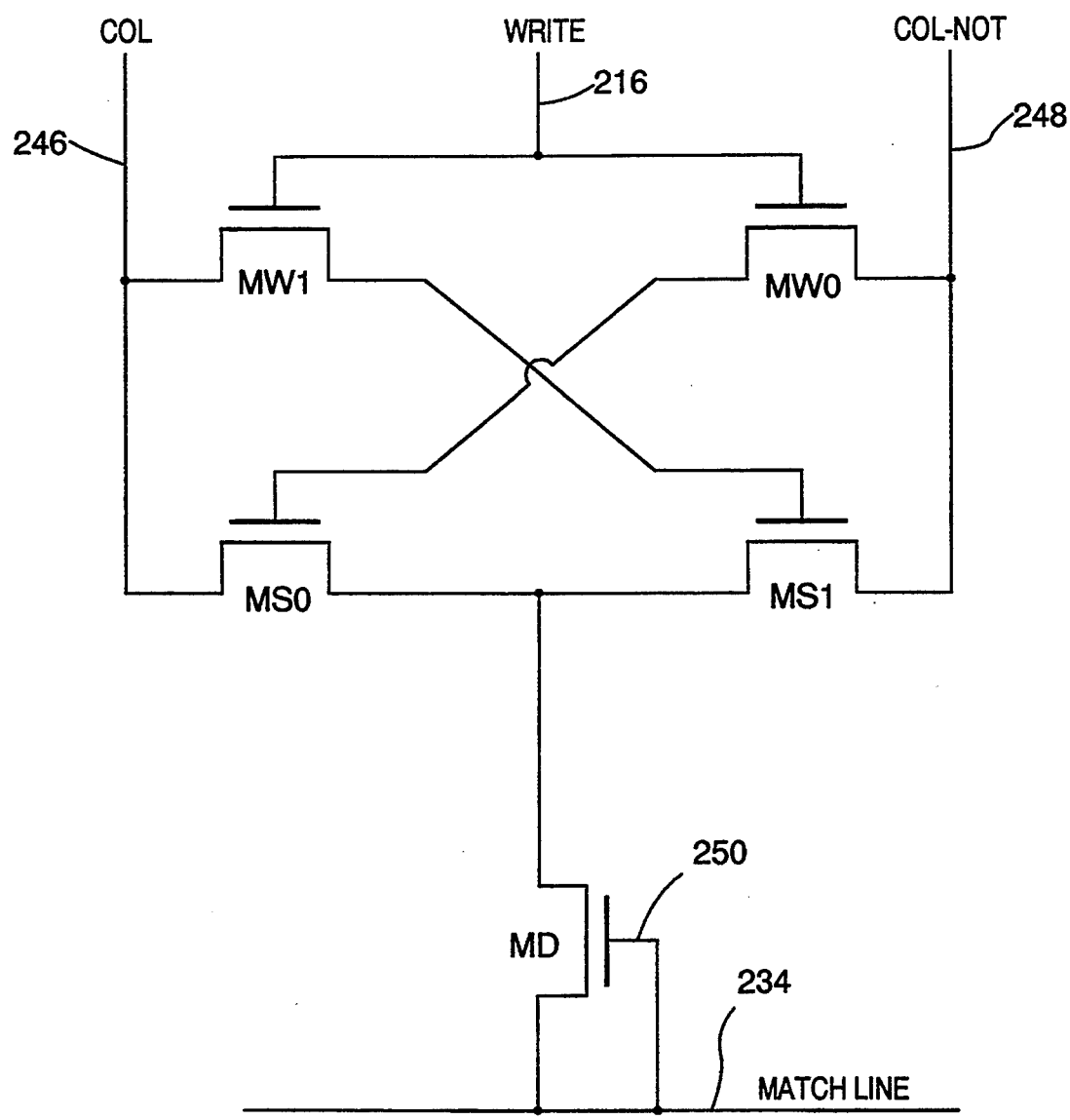
FIG. 2 is a schematic illustration of the prior art Wade memory cell.
Figure 3:
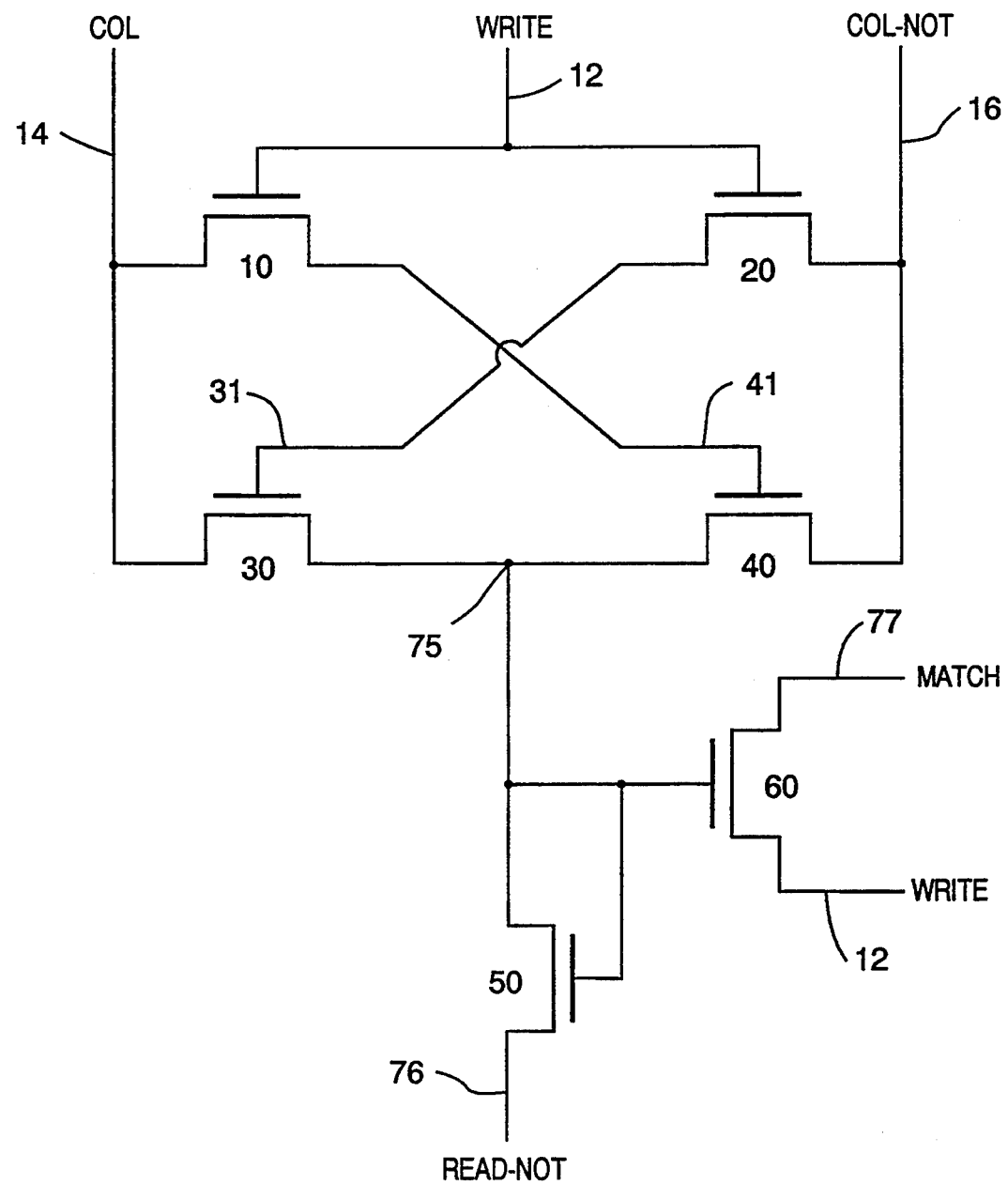
FIG. 3 is a schematic illustration of the present content addressable memory cell.
Figure 3:
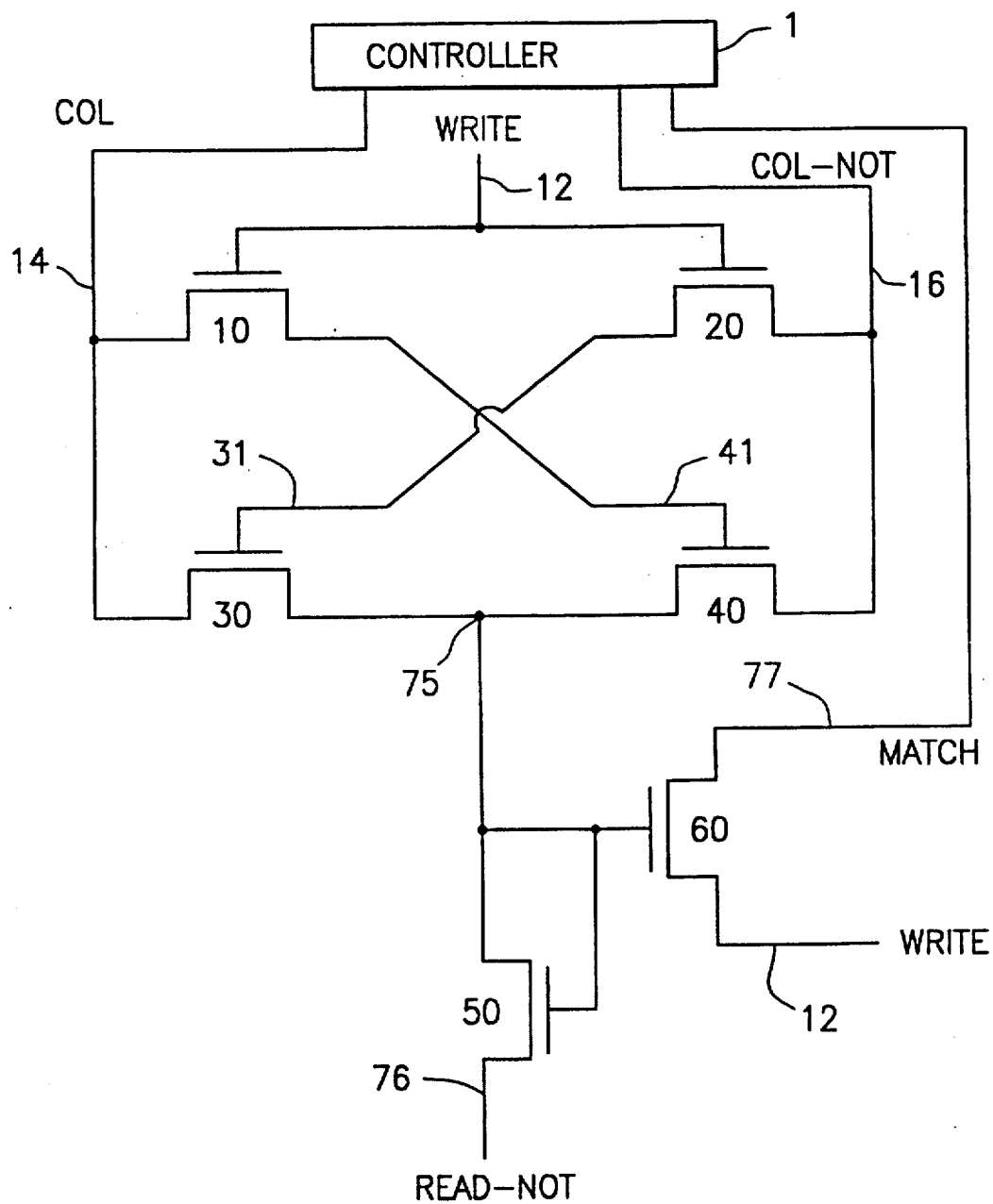

The dynamic content addressable memory cell of the preferred embodiment is made up of six transistors as shown in FIG. 3. The transistors 10, 20, 30 and 40 are cross coupled for forming a storage cell for the memory read, memory write and matching operations. A Write line 12 is coupled to the gate to control the transistor 10 and the transistor 20. A Column line 14 is coupled to the source of the transistor 10 and the transistor 30. Similarly, a Column-Not line 16 is coupled to the source of the transistor 20 and the transistor 40. The drain of the transistor 10 is coupled to the gate of the transistor 40 and the drain of the transistor 20 is coupled to the gate of the transistor 30 forming the storage nodes, 31 and 41, respectively.

The drains of the transistor 30 and the transistor 40 are connected together forming a sense node 75. The drain and gate of a transistor 50 and the gate of a transistor 60 are also coupled to the drains of the transistors 30 and 40 at the sense node 75. A Read-Not line 76 is connected to the drain of the transistor 50. The Write line 12 is connected to the source of the transistor 60 and a Match line 77 is coupled to its drain. This circuit is a dynamic content addressable memory cell in which a single data bit can be stored, read, or matched against a corresponding data bit.

During a Write operation, the Column line 14 and the Column-Not line 16 (referred to collectively as the I/O lines) are coupled to an appropriate voltage source so that they remain the opposite binary state from each other using any known technique. Upon activating the Write line 12 by raising it to a logic "1", the transistors 10 and 20 provide a low impedance path from the Column line 14 and the Column-Not line 16 to the gates of the transistors. Because the two transistors 10 and 20 are essentially activated simultaneously, the two storage nodes 31 and 41 are conditioned to opposite binary logic states. The storage nodes are cross-coupled to the I/O lines so that a stored "1" will always be placed on the gate of a transistor whose source is a logic "0", and the initial potential of the high storage node will not be less than the voltage of the high column line minus the threshold voltage of the appropriate transistor, either the transistor 10 or the transistor 20.

To transfer data from the I/O lines to the storage nodes 31 and 41, the Write line 12 must be brought to a high potential. By activating the Write line, each of the I/O lines will be coupled to its respective storage node through the low impedance path of the then saturated transistors 10 and 20. Thus, the potential on the I/O lines will charge the gate capacitance of the respective transistor 30 or the transistor 40, depending on the sense of the data to be stored. If the data bit to be stored is a "1", the Column line 14 will be at a high potential and the Column-Not line 16 will be at a low potential. When the Write line is activated, the gate capacitance of the transistor 40 will be charged to a high potential and the gate capacitance of the transistor 30 will be discharged to a low potential. After the Write operation is finished, the Write line 12 is brought to a low potential causing the transistors 10 and 20 to approximate open circuits. The gates of transistors 30 and 40 are electrically isolated from the I/O lines thereby storing the data at the storage nodes. Because of the parasitic nature of the gate capacitances the potential stored on the gates of the transistors 30 and 40 will "bleed off" and thus this potential will require periodic refreshing. A refresh of the data can be accomplished by performing a Read operation followed by a Write operation.

To read data stored on the storage nodes, 31 and 41, both the Column line 14 and the Column-Not line 16 must be precharged high and the Read-Not line 76 discharged low. According to the sense of the stored data, either the Column line or the Column-Not line will be discharged into the Read-Not line. A sense amp, connected between the Column line and the Column-Not line, will then signal which one of those lines has been discharged and from this the sense of the stored data can be determined.

If the data bit stored at the storage nodes 31 and 41 is a "1", the potential stored on the gate of the transistor 40 will be a high and the potential stored on the gate of the transistor 30 will be a low. To begin a Read operation, the potential of the I/O lines will first be charged high. The Read-Not line 76 is then discharged low. The Column-Not line 16 is then discharged into the Read-Not line because the data stored was a "1" and the potential on the gate of the transistor 40 was high thus providing a low impedance path from the Column-Not line to the Read-Not line through the transistor 40 and the transistor 50. The sense amp will then detect that the Column-Not line is the I/O line that is discharging and from this it can be determined that the data stored on the storage nodes 31 and 41 is a "1". During a read operation the present cell determines the data stored in the memory cell by sensing which I/O line is discharging and because of this, read operations are conducted much faster than in previous content addressable memory cells which would determine the I/O line that was being charged to determine the sense of the data.

To perform a Match operation, both the Column line 14 and the Column-Not line 16 must be discharged to a low potential, the Match line 77 and the Read-Not line 76 must be charged to a high potential, and the Write line 12 must then be discharged low. Forcing both of the I/O lines low will guarantee that the sense node 75 will remain at a low potential and the Match line will not be inadvertently discharged. Next, according to the sense of the data to be searched for, one of the I/O lines will be raised to a high potential. If the data stored at the storage nodes 31 and 41 agrees with the data on the I/O lines, the sense node 75 will remain at a low potential and the match line 77 will remain at a high potential. If the data stored in the storage nodes 31 and 41 does not agree with the data present on the I/O lines, a high potential will be passed from the high I/O line to the sense node 75. As the voltage at the sense node rises, the voltage at the gate of the active transistor will also rise accordingly. This "bootstrapping" of the gate voltage on the active transistor will cause that voltage to rise to a potential higher than the voltage of the high I/O line minus the threshold voltage of the appropriate one of the transistors 30 or 40, allowing the sense node to rise to the full potential of the active column line without threshold drops and maximizing the gate voltage of the transistor 60. This high potential at the gate of the transistor 60 allows the Match line to be discharged faster than previous content addressable memory cells.

If the data stored at the storage nodes 31 and 41 is a "1", the potential stored on the gate of the transistor 40 will be a high and the potential stored on the gate of the transistor 30 will be a low. To perform a Match operation, the Column line 14, the Column-Not line 16 and the Write lines 12 must all be discharged low. The Match line 77 and the Read-Not line 76 must be charged high. If the data to be searched for is also a "1", the Column line will be raised to a high potential and the Column-Not line will remain low causing the sense node, 75, to remain at a low potential and the Match line will remain undisturbed at a high potential.

If the data to be searched for is a "0", the Column line 14 will remain low and the Column-Not line 16 will be raised to a high potential. This will cause the voltage at the sense node 75 to rise to a high potential and the gate voltage of the transistor 40 will be coupled higher, or "bootstrapped" to a potential higher than the voltage on the Column-Not line minus the threshold voltage of the transistor 40. This high potential at the sense node 75 will appear at the gate of the transistor 60 causing the Match line to be discharged into the Write line 77 and signalling that a Match did not occur.

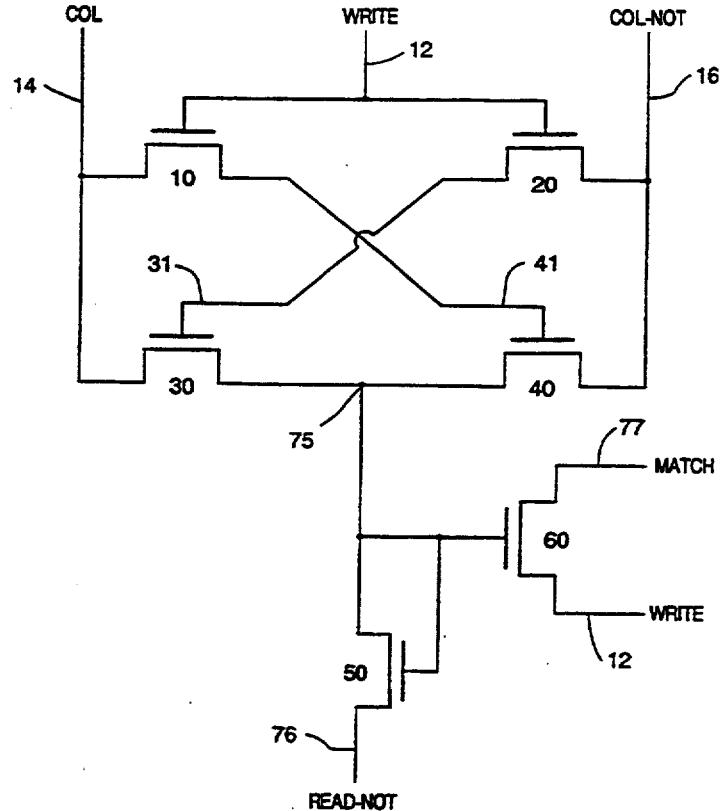

I claim:

1. A content addressable dynamic memory cell having a column input and a column-not input comprising:
   a. means for preconditioning the column input and the column-not input to a predetermined logic state thereby forming a preconditioned column input and a preconditioned column-not input wherein the column and column-not inputs have opposite logic states one from the other;
   b. means for coupling the preconditioned column input and column-not input to the cell forming a stored memory state voltage;
   c. means for coupling the stored memory state voltage to a read-not node comprising means for reading the stored memory state;
   d. means for subsequently preconditioning the column input and the column-not input to a predetermined matching logic state; and
   e. means for comparing the predetermined matching logic state voltage to the stored memory state voltage comprising means for boot-strapping a sense node voltage to a voltage higher than the stored memory state voltage if the matching logic state and the stored memory state are not the same.

2. The dynamic memory cell according to claim 1 further comprising:
   a. a write line coupled to the memory cell for controlling the memory cell;
   b. a first transistor coupled to the column input to be controlled by the write line;
   c. a second transistor coupled to the column-not input to be controlled by the write line;
   d. a third transistor coupled to the column input to be controlled by the second transistor; and e. a fourth transistor coupled to the column-not input and the third transistor, to be controlled by the first transistor.

3. The dynamic memory cell according to claim 2 further comprising:
   a. a match line coupled to the memory cell;
   b. a read-not line coupled to the memory cell;
   c. a fifth transistor coupled to the read-not line to be controlled by the third and fourth transistors, providing a discharge path to be utilized during a read operation; and
   d. a sixth transistor coupled to the match line and the write line, to be controlled by the third and fourth transistors.

4. The dynamic memory cell as claimed in claim 3 wherein the transistors are enhancement mode NMOS transistors.

5. The dynamic memory cell as claimed in claim 3 further comprising:
   a. means for precharging the match line to a high voltage state;
   b. means for providing a discharge path for the match line if the matching logic state voltage and the stored memory state voltage are not the same.

6. The dynamic memory cell as claimed in claim 5 wherein the discharge of the match line is through the sixth transistor.

7. The dynamic memory cell as claimed in claim 6 wherein the sixth transistor is an enhancement mode NMOS transistor.

8. A content addressable dynamic memory cell comprising:
   a. a first transistor having a first gate, a first source and a first drain;
   b. a column node coupled to the first source;
   c. a second transistor having a second gate, a second source and a second drain;
   d. a column-not node coupled to the second source;
   e. a write node coupled to the first and second gate
   f. a third transistor having a third gate, a third source and a third drain, wherein the third source is coupled to the column node and the third gate is coupled to the second drain;
   g. a fourth transistor having a fourth gate, a fourth source and a fourth drain wherein the fourth source is coupled to the column-not node and the fourth gate is coupled to the first drain and wherein the third drain is coupled to the fourth drain;
   h. a fifth transistor having a fifth gate, a fifth source and a fifth drain wherein the fifth drain and the fifth gate are coupled to the third drain;
   i. means for generating a read-not signal coupled to provide the read-not signal to the fifth source;
   j. a sixth transistor having a sixth gate, a sixth source and a sixth drain wherein the sixth gate is coupled to the third drain and the sixth source is coupled to the write node; and
   k. means for generating a match signal coupled to provide the match signal to the sixth drain.

9. The dynamic memory cell as claimed in claim 8 further comprising a sense amp coupled to the column node and the column-not node for determining which of the above inputs is discharging.

10. The dynamic memory cell as claimed in claim 9 further comprising a sense amp coupled to the match line.

11. The dynamic memory cell as claimed in claim 8 wherein the transistors are enhancement mode NMOS transistors.

* * * * *

UNITED STATES PATENT AND TRADEMARK OFFICE
CERTIFICATE OF CORRECTION

PATENT NO.  : 5,428,564
DATED       : June 27, 1995
INVENTOR(S) : Kel D. Winters It is certified that error appears in the above-identified patent and that said Letters Patent is hereby corrected as shown below:

The title page, should be deleted to appear as per attached title page

The sheet of drawings, consisting of figure 3, should be deleted to appear as per attached sheet.

Signed and Sealed this

Twenty-sixth Day of March, 1996

Attest:

BRUCE LEHMAN

Attesting Officer     Commissioner of Patents and Trademarks

United States Patent [19]

Winters

[11] Patent Number: 5,428,564
[45] Date of Patent: Jun. 27, 1995

[54] SIX TRANSISTOR DYNAMIC CONTENT ADDRESSABLE MEMORY CIRCUIT

[75] Inventor: Kel D. Winters, Moscow, Id.

[73] Assignee: Advanced Hardware Architectures, Inc., Moscow, Id.

[21] Appl. No.: 924,676

[22] Filed: Aug. 3, 1992

[51] Int. Cl.$^6$ ............................................. G11C 13/00
[52] U.S. Cl. ..................................... 365/49; 365/174; 365/154
[58] Field of Search ................. 365/49, 174, 154, 188, 365/189.01, 190, 203

[56] References Cited

U.S. PATENT DOCUMENTS

| 3,701,980 | 10/1972 | Mundy | 365/49 |
| 4,831,585 | 5/1989 | Wade et al. | 365/49 |
| 5,111,427 | 5/1992 | Kobayashi | 365/49 |
| 5,126,968 | 6/1992 | Hamamoto | 365/49 |

OTHER PUBLICATIONS

J. Mindy, et al., "Low-Cost Associative Memory," IEEE Journal of Solid-State Circuits, vol. SC-7, p. 364-9, Oct. 1972.
J. Wade and C. Sodini, "Dynamic Cross-Coupled Bit-line Content Addressable Memory Cell For High Density Arrays," IEEE 85, p. 284-7, 1985.

*Primary Examiner*—Joseph A. Popek
*Assistant Examiner*—A. Zarabian
*Attorney, Agent, or Firm*—Haverstock, Medlen & Carroll

[57] ABSTRACT

A content addressable memory cell includes six transistors connected together to perform memory read, memory write, and matching operations. This cell has the ability to perform typical memory write and memory read operations as well as the capability of signalling whether or not its stored data matches data that is being searched for. A cross-coupling scheme is used in the memory cell so that a high potential will always be stored on the gate of a transistor whose source is at ground. This cross-coupling scheme increases the amount of charge stored on the storage transistor and decreases the required frequency of refresh operations. In addition to the transistors configured to store data, an additional transistor configured as a diode is used as a rapid discharge path to maximize the efficiency of the cell during a read operation. During a match operation another transistor is utilized to discharge the Match line quickly in the event the stored data does not match the data that is being searched for.

11 Claims, 3 Drawing Sheets